(12) United States Patent
Fujita et al.

(10) Patent No.: US 11,972,877 B2
(45) Date of Patent: Apr. 30, 2024

(54) SUPERCONDUCTING WIRE CONNECTOR AND METHOD OF CONNECTING SUPERCONDUCTING WIRES

(71) Applicant: HITACHI, LTD., Tokyo (JP)

(72) Inventors: Shinji Fujita, Tokyo (JP); Tsuyoshi Wakuda, Tokyo (JP); Yota Ichiki, Tokyo (JP); Motomune Kodama, Tokyo (JP)

(73) Assignee: HITACHI, LTD., Tokyo (JP)

( * ) Notice: Subject to any disclaimer, the term of this patent is extended or adjusted under 35 U.S.C. 154(b) by 584 days.

(21) Appl. No.: 17/186,223

(22) Filed: Feb. 26, 2021

(65) Prior Publication Data
US 2021/0272722 A1    Sep. 2, 2021

(30) Foreign Application Priority Data
Mar. 2, 2020    (JP) .................................. 2020-035296

(51) Int. Cl.
*H01B 12/00*    (2006.01)
*H01B 12/02*    (2006.01)
(Continued)

(52) U.S. Cl.
CPC .............. *H01B 12/02* (2013.01); *H01R 4/68* (2013.01); *H10N 60/202* (2023.02); *H10N 60/80* (2023.02)

(58) Field of Classification Search
CPC ...... H01B 12/02; H10N 60/80; H10N 60/202; H01R 4/68
See application file for complete search history.

(56) References Cited

U.S. PATENT DOCUMENTS 5,929,000 A * 7/1999 Hahakura .......... H10N 60/0801
                                                505/231
6,313,408 B1 * 11/2001 Fujikami ................ H01B 12/02
                                                505/231
(Continued)

FOREIGN PATENT DOCUMENTS

CN    106782999 A    5/2017
JP    2006-174546 A    6/2006
(Continued)

OTHER PUBLICATIONS

Yota JP 2013122981 A; English Translation (Year: 2013).*
(Continued)

*Primary Examiner* — Pete T Lee
(74) *Attorney, Agent, or Firm* — MATTINGLY & MALUR, PC

(57) ABSTRACT

A superconducting wire connector includes superconducting wires and a sintered body containing $MgB_2$. The superconducting wires are connected by the sintered body. At least one of the superconducting wires includes a superconducting core having a first outer surface. The sintered body is in contact with the first outer surface. A method of connecting superconducting wires by a sintered body containing $MgB_2$ includes exposing a superconducting core of at least one of the superconducting wires by removing a portion, positioned in the middle in a longitudinal direction of the at least one of the superconducting wires, of a metal sheath disposed around the superconducting core, disposing the at least one of the superconducting wires through a container, filling the container with a raw material of $MgB_2$, and forming the sintered body being in contact with an outer surface of the superconducting core by sintering the raw material filled in the container.

15 Claims, 8 Drawing Sheets

(51) Int. Cl.
    *H01R 4/68*         (2006.01)
    *H10N 60/20*      (2023.01)
    *H10N 60/80*      (2023.01)

(56) References Cited

U.S. PATENT DOCUMENTS

| | | |
|---|---|---|
| 2006/0240991 A1 | 10/2006 | Takahashi et al. |
| 2008/0274900 A1* | 11/2008 | Shimoyama ...... C04B 35/58057 419/7 |
| 2012/0108435 A1 | 5/2012 | Ichiki et al. |
| 2018/0012682 A1 | 1/2018 | Ichiki et al. |
| 2019/0207331 A1 | 7/2019 | Ichiki et al. |

FOREIGN PATENT DOCUMENTS

| | | |
|---|---|---|
| JP | 2012-094413 A | 5/2012 |
| JP | 2013-122981 A | 6/2013 |
| JP | 2017-208156 A | 11/2017 |
| WO | 2013/161475 A1 | 10/2013 |
| WO | 2015/015627 A1 | 2/2015 |

OTHER PUBLICATIONS

Tanaka JP 2013225598 A; English Translation (Year: 2013).*
Chinese Office Action received in corresponding Chinese Application No. 202110215384.9 dated Nov. 23, 2022.
Extended European Search Report received in corresponding European Application No. 21159893.3 dated Jul. 21, 2021.
Japanese Office Action received in corresponding Japanese Application No. 2020-035296 dated Apr. 18, 2023.

* cited by examiner

SUPERCONDUCTING WIRE CONNECTOR AND METHOD OF CONNECTING SUPERCONDUCTING WIRES

CROSS REFERENCE TO RELATED APPLICATIONS

This application claims the foreign priority benefit under 35 U.S.C. § 119 of Japanese patent application No. 2020-035296 filed on Mar. 2, 2020, the disclosure of which is incorporated herein by reference.

BACKGROUND OF THE INVENTION

1. Field of the Invention

The present invention relates to a superconducting wire connector including magnesium diboride ($MgB_2$) and a method of connecting superconducting wires using magnesium diboride ($MgB_2$).

2. Description of the Related Art

Magnetic resonance imaging (MRI) apparatuses and nuclear magnetic resonance (NMR) apparatuses include superconducting coils composed of wound superconducting wires. These apparatuses require high magnetic-field stability, and thus they are operated in a permanent current mode with closed circuits formed of superconducting materials. Hence, superconducting coils, permanent current switches, wires for connecting those, and other units need to be superconductively connected to one another in those unit.

For the superconducting coils, superconducting wires formed of metal-based superconductors such as niobium-titanium (NbTi), niobium-three-tin ($Nb_3Sn$), and the like have been widely used conventionally. Since these superconducting wires have low critical temperatures, they are cooled with liquid helium during operation. For superconducting wires having low critical temperatures, techniques have been established for superconductively connecting wires using a superconducting solder such as a lead bismuth (PbBi) alloy.

Magnesium diboride ($MgB_2$) is a superconductor having a higher critical temperature than NbTi, $Nb_3Sn$, and the like. $MgB_2$ does not require cooling using liquid helium, and freezer cooling can be used for it. In addition, $MgB_2$ has higher magnetic-field stability than conventional oxide-based superconductors and is suitable also for permanent current mode operation. Hence, $MgB_2$ is expected to be put into industrially practical use.

The critical temperature of $MgB_2$ is approximately 39K while the critical temperatures of conventional superconducting solders are lower than 10K. Hence, if a superconducting solder is used, the operating temperature as a whole is limited up to the critical temperature of the superconducting solder.

In the situation described above, various developments are being conducted to achieve appropriate superconductive connection for $MgB_2$ superconducting wires having superconducting cores made of $MgB_2$.

Japanese Patent Application Publication No. 2006-174546 (hereinafter called patent document 1) discloses a technique for superconductively connecting $MgB_2$ superconducting wires in a connection metal tube in which the $MgB_2$ superconducting wires are placed to be in contact with each other via a superconducting coating layer and in which superconducting solder is filled. The $MgB_2$ superconducting wires are superconductively connected in the state where they are inserted into the metal tube for connection. The superconductive connection as above using superconducting solder is used also for general superconducting wires such as NbTi.

Japanese Patent Application Publication No. 2012-094413 (hereinafter called patent document 2) discloses a technique for superconductively connecting a plurality of superconducting wires by inserting the superconducting wires into a container for connection, charging a mixed powder of magnesium and boron into the container, and pressurizing and heat-treating the mixed powder. In patent document 2, the mixed powder of magnesium and boron charged in the container is heat-treated to produce a sintered body of $MgB_2$ between the superconducting wires.

Japanese Patent Application Publication No. 2017-208156 (herein after called patent document 3) discloses a method in which Mg is placed in a container for connection such that the Mg adjoins superconducting wires inserted in the container. The ends of the superconducting wires are polished before the superconducting wires are inserted into the container for connection. The superconducting wires are inserted in the container with the cores exposed at the end surfaces of the superconducting wires.

SUMMARY OF THE INVENTION

In the technique disclosed in patent document 1, the superconducting solder used has a low critical temperature of approximately 9K. Hence, the superconducting wires also need to be cooled to a temperature lower than or equal to the critical temperature of the superconducting solder. For example, in the case of using $MgB_2$ superconducting wires for a superconducting magnet, the operating temperature of the whole unit including the wound wires has to be lower than or equal to the critical temperature of the superconducting solder. Such a technique cannot utilize sufficiently the advantage of $MgB_2$ having a high critical temperature.

In the technique disclosed in patent document 2, the superconducting wires are superconductively connected via the sintered body containing $MgB_2$ in the metal container. However, most of the superconducting wires are not fixed in the metal container. In patent document 1, the superconducting wires are fixed with superconducting solder throughout the inside of the container. Unlike patent document 1, the superconducting wires in patent document 2 are fixed only at around the opening of the container and at the portion in contact with the sintered body containing $MgB_2$.

In the case where there is a non-fixed area in the periphery of the superconducting wire as in patent document 2, when a transport current flows through the superconducting wire, and the magnetic force acts on the superconducting wire, mechanical loads are exerted on both sides of the area. The portion at which a superconducting core and the sintered body containing $MgB_2$ is joined is mechanically fragile. Hence, if a mechanical load is exerted on such a portion, the conduction characteristics such as critical current density may deteriorate.

To solve these problems in the technique disclosed in patent document 3, Mg is excessively put in before the heat treatment to produce the $MgB_2$ sintered body, and after the heat treatment, solder is poured in, so that high conduction characteristics are achieved with less variation. However, in the case where a stabilizing material that hinders the production of $MgB_2$ such as copper, or a copper alloy, or the like is used in the superconducting wire, the stabilizing material reacts with Mg and impedes the production of $MgB_2$, causing variation in the conduction characteristics.

As described in patent documents 2 and 3, if the end of the superconducting wire is obliquely cut so as to form an acute angle before the superconducting wire is inserted into the container for connection, the contact area of the superconducting core and the sintered body containing $MgB_2$ is larger, and this improves the conduction characteristics of the connection unit. However, cutting as above makes a difference in the length of the superconducting wire between on the tip end side having an acute angle and on the opposite end side having an obtuse angle. If a superconducting wire has a length difference, thermal strain caused when the superconducting wire is cooled after heat treatment makes the superconducting wire warped. If the superconducting wire warps, the superconducting core would separate from the sintered body containing $MgB_2$, causing a problem of degradation of the conduction characteristics.

In light of the above situation, an object of the present invention is to provide a superconducting wire connector and a method of connecting superconducting wires in which superconducting wires are connected by a sintered body containing $MgB_2$ and that is capable of providing high conduction characteristics.

In response to the above issues, a superconducting wire connector according to the present invention includes superconducting wires and a sintered body containing $MgB_2$. The superconducting wires are connected by the sintered body. At least one of the superconducting wires includes a superconducting core having a first outer surface. The sintered body is in contact with the first outer surface.

Furthermore, a method of connecting superconducting wires by a sintered body containing $MgB_2$ according to the present invention includes exposing a superconducting core of at least one of the superconducting wires by removing a portion, positioned in the middle in a longitudinal direction of the at least one of the superconducting wires, of a metal sheath disposed around the superconducting core, disposing the at least one of the superconducting wires through a container, filling the container with a raw material of $MgB_2$, and forming the sintered body being in contact with an outer surface of the superconducting core by sintering the raw material filled in the container.

the present invention is to provide a superconducting wire connector and a method of connecting superconducting wires in which superconducting wires are connected by a sintered body containing $MgB_2$ and that is capable of providing high conduction characteristics.

DETAILED DESCRIPTION OF THE EMBODIMENTS

Figure 1A:
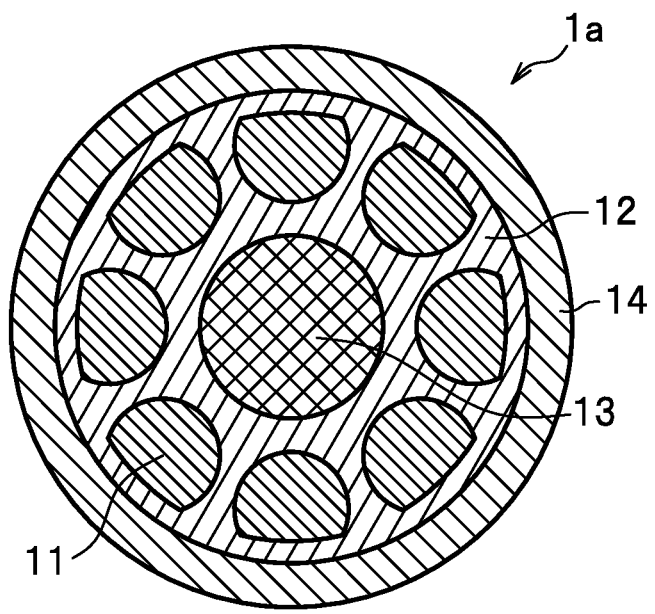
FIG. 1A is a schematic cross-sectional view of a structure example of an $MgB_2$ superconducting wire.

Hereinafter, a superconducting wire connector and a method of connecting superconducting wires according to an embodiment of the present invention will be described with reference to the figures. In the following figures, common constituents are denoted by the same symbols, and description thereof is omitted.

The superconducting wire connector according to the present embodiment has a structure in which a plurality of superconducting wires are integrated with a sintered body containing $MgB_2$. This superconducting wire connector includes a plurality of superconducting wires and the sintered body containing $MgB_2$. The superconducting wires are superconductively connected with each other via a bulk of the sintered body containing $MgB_2$.

To form the superconducting wire connector according to the present embodiment, a container for superconductive connection is used, and the superconducting wire connector is formed integrally with the container. To superconductively connect superconducting wires to each other, each superconducting wire is subjected to cutting, polishing, or the like to expose superconducting cores covered with a metal sheath. Then, each superconducting wire with its superconducting cores exposed is inserted into the container for connection, and a row material for $MgB_2$ is charged into the container.

After the superconducting wires are inserted into the container for connection, and the raw material for $MgB_2$ is charged and pressurized, the raw material is heat-treated to produce a sintered body containing $MgB_2$ integrated with each of the superconducting wires. Since this method integrates the superconducting wires with the sintered body containing $MgB_2$, it is possible to provide a superconducting wire connector through which current flows in a superconducting state.

In conventional methods, to connect superconducting wires superconductively, cutting, polishing, or the like is performed on the end of each superconducting wire to expose the end surfaces of the superconducting cores, and those end surfaces of the superconducting cores exposed in the end of the superconducting wire are exposed in a container for superconductive connection, as described in patent documents 2 and 3. A sintered body containing $MgB_2$ is in contact with the end surfaces of the superconducting cores in the state where the superconducting wire connector is formed.

Unlike the conventional methods, in the superconducting wire connector according to the present embodiment, a sintered body containing $MgB_2$ is in contact not with the end surfaces of the superconducting cores but with the outer peripheral surfaces of the superconducting cores. The outer peripheral surfaces of the superconducting cores are exposed to the outside of the superconducting wire by partially removing a metal sheath located outer than the superconducting cores. The superconducting cores the outer peripheral surfaces of which are exposed as above are integrated with the sintered body containing $MgB_2$ in the container for superconductive connection.

For the superconducting wires for superconductive connection, for example, $MgB_2$ superconducting wires having superconducting cores made of $MgB_2$ can be used. Use of $MgB_2$ superconducting wires makes it possible to increase the operating temperature of the whole part including a connector to a temperature close to the critical temperature of $MgB_2$ which is higher than in the case of using conventional superconducting solders.

For the superconducting wires for superconductive connection, superconducting wires having superconducting cores made of NbTi, $Nb_3Sn$, or the like may also be used. Even in the case superconducting wires made of a material other than $MgB_2$ are used, since the superconducting wires are connected to each other via $MgB_2$ the critical temperature of which is high, it is possible to achieve more stable superconductive connection than in the case of using conventional superconducting solders.

Figure 1B:
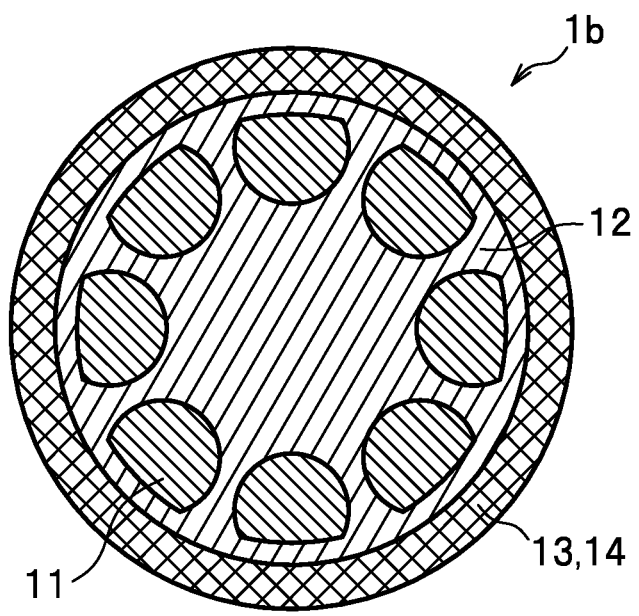
FIG. 1B is a schematic cross-sectional view of a structure example of an $MgB_2$ superconducting wire.

FIGS. 1A and 1B are schematic cross-sectional views of structure examples of $MgB_2$ superconducting wires.

As illustrated in FIGS. 1A and 1B, $MgB_2$ superconducting wires 1a and 1b each include superconducting cores 11 containing $MgB_2$, base material 12 covering the outer periphery of the superconducting cores 11, stabilizing material 13 to provide the electrical stability and thermal stability of superconductivity, and a metal sheath 14 covering the superconducting cores 11 and the base material 12.

The $MgB_2$ superconducting wires 1a and 1b have a multi-core structure including a plurality of superconducting cores 11. A superconducting wire commonly has a multi-core structure including a plurality of superconducting cores from the viewpoints of current capacity, wire length, electromagnetic stability, AC loss, and other factors. In FIGS. 1A and 1B, eight superconducting cores 11 are arranged in a circular shape. However, the number and arrangement of superconducting cores 11 are not limited to any particular number or arrangement.

In the $MgB_2$ superconducting wire 1a, as illustrated in FIG. 1A, the stabilizing material 13 is closer to the center than the superconducting cores 11. The superconducting cores 11 are arranged around the stabilizing material 13 regularly at intervals in the circumferential direction of the wire. The outer periphery of the superconducting cores 11 is covered with the base material 12. On the outside of the superconducting cores 11 is provided the metal sheath 14 in a tubular shape.

In contrast, in the $MgB_2$ superconducting wire 1b, as illustrated in FIG. 1B, the stabilizing material 13 is located on the outside of the superconducting cores 11. At the portion at or closer to the center of the wire is located the base material 12, and the stabilizing material 13 is not located on the inside of the superconducting cores 11. In some cases, a center material other than the base material 12 and the stabilizing material 13 is disposed at the center of the wire. The superconducting cores 11 are arranged regularly at intervals in the circumferential direction of the wire. The outer periphery of the superconducting cores 11 are covered with the base material 12. On the outside of the superconducting cores 11 is disposed the stabilizing material 13 in a tubular shape, which corresponds to the metal sheath 14.

The superconducting core 11 containing $MgB_2$ is typically formed by a powder-in-tube (PIT) method. In the PIT method, raw material powder is charged into a metal tube, and the metal tube is subjected to wire-drawing. Thus, the base material 12 is mainly formed from the not-illustrated metal tube containing superconducting cores 11 inside.

The metal tube containing superconducting cores 11 inside is formed of a barrier material. The barrier material is for preventing, during eat treatment to produce $MgB_2$, the reaction between the raw material for $MgB_2$ and copper or the like used for a stabilizing material 13. Thus, in both the $MgB_2$ superconducting wires 1a and 1b, the base material 12 serving as barrier material is interposed between the superconducting cores 11 and the stabilizing material 13.

For the superconducting wires for superconductive connection, both the $MgB_2$ superconducting wire 1a illustrated in FIG. 1A and the $MgB_2$ superconducting wire 1b illustrated in FIG. 1B may be used. However, the $MgB_2$ superconducting wire 1a having the stabilizing material 13 closer to the center than the superconducting cores 11 may be used because it is more effective when applied to the superconducting wire connector according to the present embodiment.

For the $MgB_2$ superconducting wire 1b in which the stabilizing material 13 is not disposed on the inside of the superconducting cores 11, in any of the case where a sintered body containing $MgB_2$ is brought into contact with the end surfaces of the superconducting cores 11 and the case where it is brought into contact with the outer peripheral surfaces of the superconducting cores 11, it is possible to remove the part of the stabilizing material 13 that can react with the raw material for $MgB_2$ by removing the metal sheath 14 at the outer periphery of the wire by cutting, polishing, or the like. However, in the case where copper used as the stabilizing material is disposed as the outer layer, it is disadvantageous on wire-drawing processing properties.

For the $MgB_2$ superconducting wire 1a in which the stabilizing material 13 is disposed on the inside of the superconducting cores 11, in the case where the sintered body containing $MgB_2$ is brought into contact with the end surfaces of the superconducting cores 11, the stabilizing material 13 is exposed together with the superconducting cores 11 at the end surface of the wire. Thus, this stabilizing material 13 has to be removed without fail. However, it is difficult to remove the stabilizing material 13 disposed on the inside of the superconducting cores 11 while leaving the superconducting cores 11, by cutting, polishing, or the like.

However, in the case of a structure in which the sintered body containing $MgB_2$ is in contact not with the end surfaces of the superconducting cores but with the outer peripheral surfaces of the superconducting cores as in the superconducting wire connector according to the present embodiment, even if the stabilizing material 13 is disposed on the inside of the superconducting cores 11 as in the $MgB_2$ superconducting wire 1a illustrated in FIG. 1A, it is possible to avoid the reaction between the stabilizing material 13 and the raw material for $MgB_2$ without removing the stabilizing material 13.

Hereinafter, a concrete structure of the superconducting wire connector will be described with reference to figures. The following description is based on an example in which two $MgB_2$ superconducting wires 1a (see FIG. 1A) are used for the superconducting wires for superconductive connection.

Figure 2:
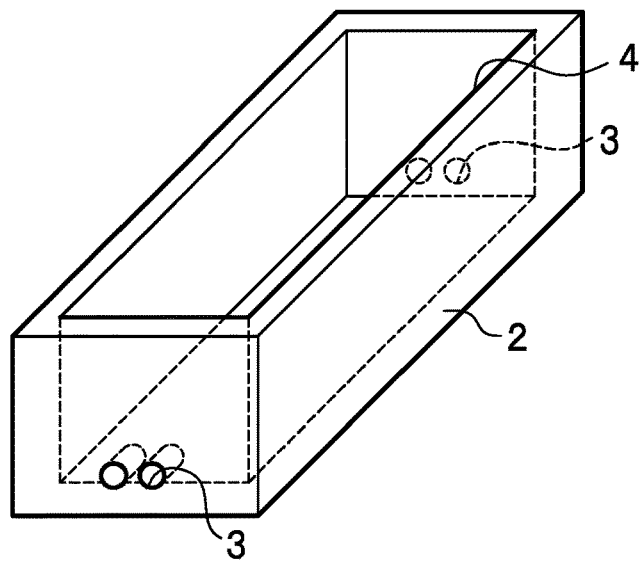
FIG. 2 is a perspective view of a container for connecting superconducting wires.
Figure 3:
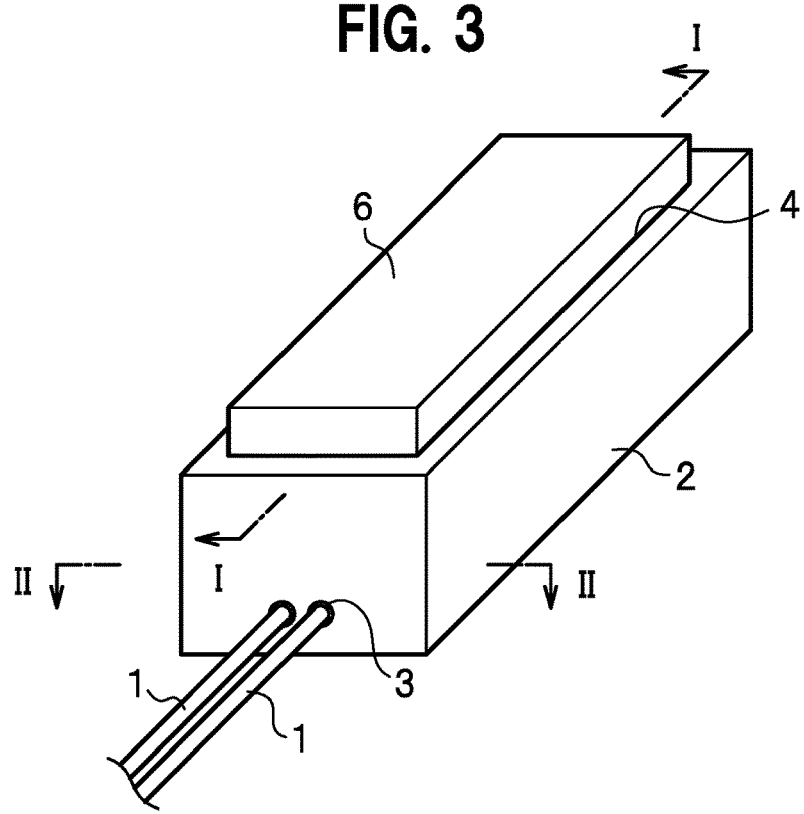
FIG. 3 is a perspective view of a connection structure in which superconducting wires are connected to each other.
Figure 4:
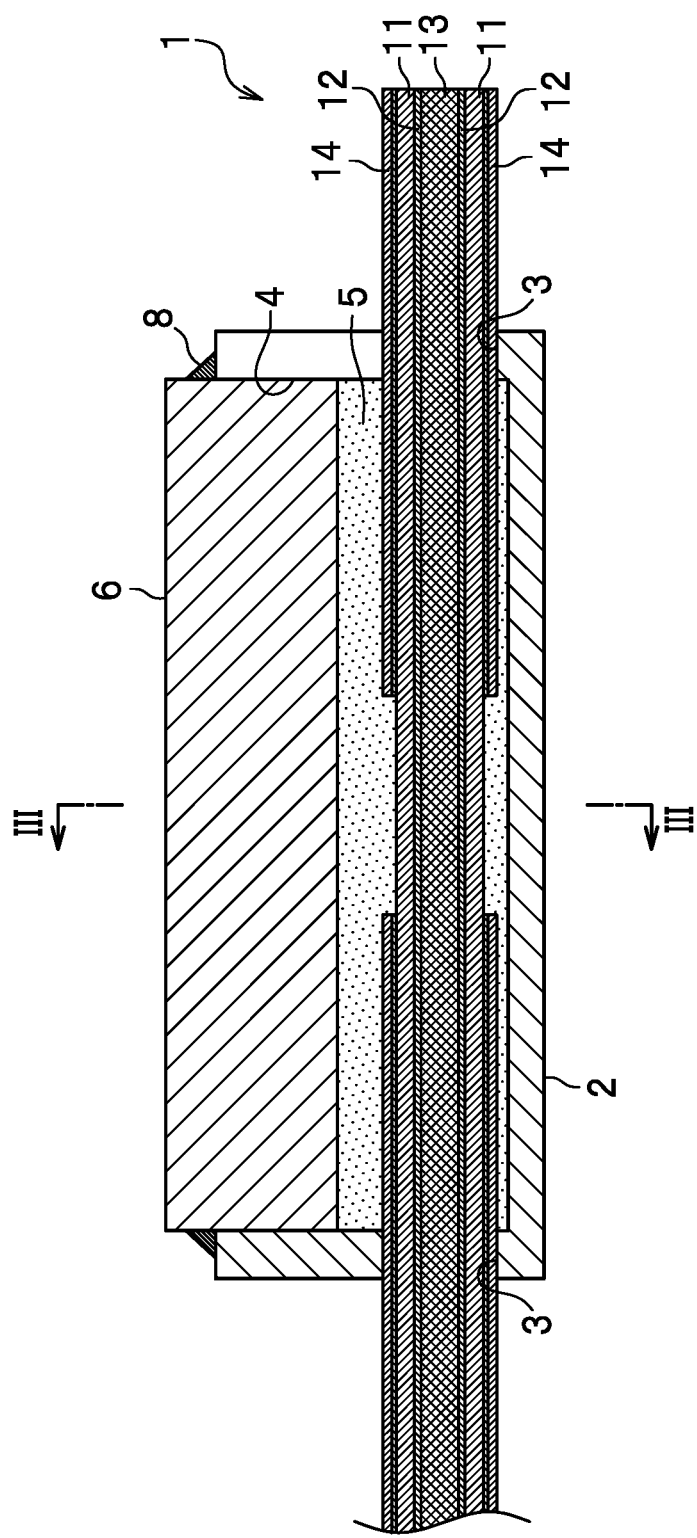
FIG. 4 is a longitudinal sectional view of the connection structure in which superconducting wires are connected to each other.
Figure 5:
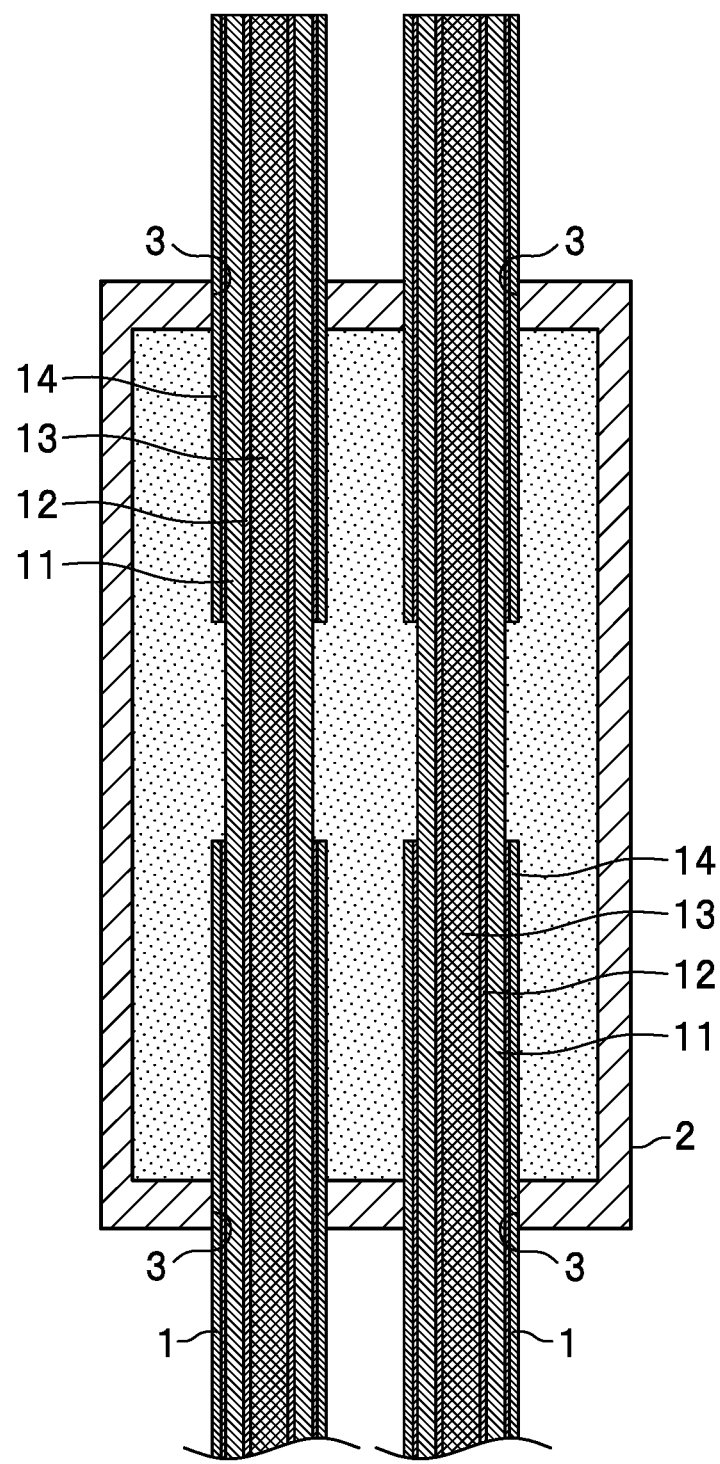
FIG. 5 is a plan sectional view of the connection structure in which superconducting wires are connected to each other.
Figure 6:
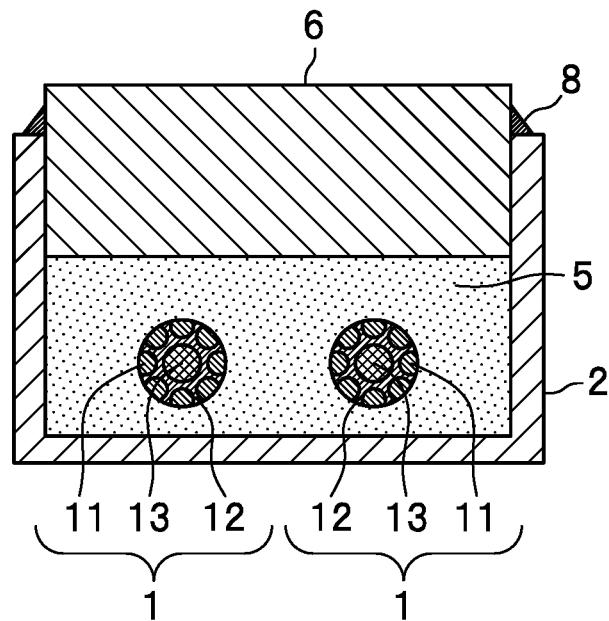
FIG. 6 is a cross-sectional view of the connection structure in which superconducting wires are connected to each other.

FIG. 2 is a perspective view of a container for connecting superconducting wires. FIG. 3 is a perspective view of a connection structure in which superconducting wires are connected to each other. FIG. 4 is a longitudinal sectional view of the connection structure in which superconducting wires are connected to each other. FIG. 5 is a plan sectional view of the connection structure in which superconducting wires are connected to each other. FIG. 6 is a cross-sectional view of the connection structure in which superconducting wires are connected to each other. FIG. 4 is a sectional view taken along line I-I in FIG. 3, FIG. 5 is a sectional view taken along line II-II in FIG. 3, and FIG. 6 is a sectional view taken along line III-III in FIG. 4.

As illustrated in FIGS. 2 to 6, the superconducting wire connector according to the present embodiment can be formed using a metal container 2 for superconductive connection. The illustrated metal container 2 has a box shape having an open face. The metal container 2 has a plurality of insertion holes 3 through which superconducting wires 1 can be inserted and an opening 4 into which a pressurizing jig 6 can be inserted.

The metal container 2 is made of a material that is less likely to react with magnesium and boron during heat treatment and other occasions. Examples of the material for the metal container 2 include Fe, Ni, Nb, Ta, and alloys of these materials. These materials are less likely to react with magnesium and boron during the heat treatment to produce a sintered body containing $MgB_2$, making it possible to achieve high uniformity in the produced sintered body containing $MgB_2$.

As illustrated in FIG. 2, the insertion holes 3 pass through side walls of the metal container 2. The insertion holes 3 are formed in both side walls in the longitudinal direction of the metal container 2. The number of insertion holes 3 formed in one side wall corresponds to two superconducting wires 1, and the insertion holes 3 are arranged side wall side on the wall. The metal container 2 may be designed such that the gap between the insertion hole 3 and the superconducting wire 1 will be small.

As illustrated in FIGS. 4 to 6, when the superconducting wires 1 are superconductively connected, the metal sheath 14 and the part of the base material 12 positioned on the outside of the superconducting cores 11 are removed so that the outer peripheral surfaces of the superconducting cores 11 will be exposed inside the metal container 2. The metal sheath 14 and specified portions are removed at a part positioned at an intermediate portion in the longitudinal direction of the wire.

Note that when the superconducting wires 1 are superconductively connected, the superconducting cores 11 may be in the state where $MgB_2$ has already been produced or in the state where magnesium and boron have not yet been reacted. In the case where magnesium and boron have not yet been reacted, $MgB_2$ can be produced in the superconducting core 11 by subjecting also the wires to heat treatment during the heat treatment for superconductive connection.

As illustrated in FIGS. 4 to 5, each superconducting wire 1 in which the superconducting cores 11 have been exposed is inserted into the insertion holes 3 in both side walls in the longitudinal direction of the metal container 2 so that the superconducting wire 1 penetrates through the metal container 2. The intermediate portion at which the superconducting cores 11 are exposed is positioned inside the metal container 2. Since the stabilizing material 13 reacts with the raw material for $MgB_2$ during heat treatment, the stabilizing material 13 needs to be positioned not to be in contact with the raw material for $MgB_2$. Hence, the end surface of the superconducting wire 1 is positioned outside the metal container 2.

In FIGS. 4 to 6, the metal sheath 14 and specified portions are removed in the entire circumference of the wire at the intermediate portion in the longitudinal direction of the wire. At the intermediate portion in the longitudinal direction of the wire, only the metal sheath 14, the part of the base material 12 on the outside of the superconducting cores 11, and the outsides of the superconducting cores 11 are removed not to expose the stabilizing material 13.

For the method for removing the metal sheath 14 and specified portions, an appropriate method may be used, for example, mechanical cutting, mechanical polishing, chemical polishing such as etching, electric cutting such as electric discharge machining, and electric polishing such as electrolytic polishing. The length of the part of the metal sheath 14 and specified portions to be removed is sufficiently long within the inside of the metal container 2 in the viewpoint of obtaining a larger critical current and other viewpoints.

As illustrated in FIG. 3, after superconducting wires 1 are inserted through the metal container 2, the metal container 2 is charged with magnesium and boron which are the raw material for $MgB_2$, and the pressurizing jig 6 is inserted into the opening 4. The pressurizing jig 6 is pressed with a press machine or the like to pressurize and compact the raw material charged in the metal container 2. The pressurizing jig 6 can be made of a material the same as or similar to the one for the metal container 2.

After the raw material is charged into the metal container 2 and pressurized, the raw material is subjected to heat treatment to produce a sintered body containing $MgB_2$. The raw material for $MgB_2$ that is charged into the metal container 2 may be mixed powder containing magnesium powder and boron powder or $MgB_2$ powder, or boron powder may be charged and pressurized first, and then magnesium may be charged.

Since magnesium volatilizes and melts at a lower temperature than boron, magnesium diffuses into solid boron, and the reaction proceeds. Thus, even the method of charging magnesium after boron powder is charged and pressurized can produce a sintered body containing $MgB_2$. In the case of charging magnesium later, the magnesium may be in the form of powder or metal lumps. In the case of using magnesium powder, after charging the powder into the metal container 2, sufficient pressurizing may be performed.

The heat treatment for the metal container 2 charged with the raw material can be performed, for example, using an electric furnace or the like. The atmosphere of the heat treatment may be the atmosphere of an inert gas such as argon gas or nitrogen gas. The heat treatment may be performed in the state in which the metal container 2 charged with the raw material is sealed to prevent the volatilization of magnesium. To seal the metal container 2, a heat-resistant adhesive 8, for example, a ceramic bond or the like, can be applied to the surroundings and the like of the pressurizing jig 6.

The temperature of the heat treatment is 500 to 900° C., and may be 650 to 850° C. In the case of a heat treatment temperature of 650° C. or higher, magnesium is heated to the melting point or higher, and thus liquid magnesium can flow and diffuse. This condition promotes the reaction and sintering to produce $MgB_2$. In the case of a heat treatment temperature of 850° C. or lower, the amount of volatilization of magnesium is reduced.

As illustrated in FIGS. 4 to 6, the heat treating of the raw material for $MgB_2$ provides a superconducting wire connector in which the superconducting wires 1 are integrated to each other with a sintered body 5 containing $MgB_2$. The sintered body 5 containing $MgB_2$ is in contact not with the end surfaces of the superconducting cores 11 but with the outer peripheral surfaces of the superconducting cores 11.

The filling factor of the sintered body 5 containing $MgB_2$ may be 70% by volume or more. The higher the filling factor, the higher conduction characteristics the superconducting wire connector provides. The filling factor mentioned above can be obtained by a method of preparing the raw material for $MgB_2$ using a mechanical milling method, a method of appropriately pressurizing the pressurizing jig 6, or the like. In this specification, the filling factor means the ratio of the regions other than pores in the sintered body containing $MgB_2$.

In the superconducting wire connector and the method of connecting superconducting wires according to the present embodiment described above, part of the metal sheath and specified portions positioned at an intermediate portion in the longitudinal direction of the wire is removed so that the sintered body containing $MgB_2$ is in contact not with the end surfaces of the superconducting cores but with the outer peripheral surfaces of the superconducting cores. Thus, unlike the case where the sintered body containing $MgB_2$ is in contact with the end surfaces of the superconducting cores, it is easy to prevent the reaction between the raw material for $MgB_2$ and the stabilizing material 13, regardless of the position of the stabilizing material in the cross section of the wire. In this way, the superconducting wire connector according to the present embodiment described above, after the heat treatment to produce the sintered body containing $MgB_2$, achieves high conduction characteristics with less variation.

With the use of the metal container 2 having a structure in which superconducting wires 1 penetrate through the metal container 2, for example, as illustrated in FIGS. 2 to 6, the end surfaces of the superconducting wires 1 are positioned outside the metal container 2, and thus it is possible to reliably prevent the reaction between the raw material for $MgB_2$ and the stabilizing material 13. Alternatively, instead of using the metal container 2 with the structure above, a container with a structure in which superconducting wires 1 are inserted but does not pass through. In the case of using such a container, the ends of the superconducting wires 1 are coated with a heat-resistant material so that the end surfaces of the superconducting wires 1 will not be exposed inside the container, and intermediate portions in the longitudinal direction of the wires that are not coated with a heat-resistant material are exposed inside the container.

The superconducting wire connector and the method of connecting superconducting wires according to the present embodiment described above make it possible to prevent superconducting wires from separating from the sintered body containing $MgB_2$ due to thermal strain.

In the case where the sintered body containing $MgB_2$ is in contact with the end surfaces of superconducting cores as in conventional techniques, the contact area between the superconducting core and the sintered body containing $MgB_2$ can be made large by obliquely cutting the end of the superconducting wire such that the end has an acute angle. Enlarging the contact area improves the conduction characteristics of the superconducting wire connector. However, cutting obliquely makes a difference in the length of the superconducting wire between the tip end side having an acute angle and the opposite end side having an obtuse angle.

The temperature of the heat treatment to produce the sintered body containing $MgB_2$ is a high temperature in the range of 500 to 900° C. In contrast, the operating temperature of superconducting wires including a connector is a low temperature around −234° C. Thus, if a superconducting wire has a length difference, when the superconducting wire is cooled after heat treatment, thermal strain makes the superconducting wire warped. When a superconducting wire is warped, the superconducting cores may be separated from the sintered body containing $MgB_2$, degrading the conduction characteristics of the connector.

Unlike the above conventional technique, in the superconducting wire connector and the method of connecting superconducting wires according to the present embodiment described above, the end of the superconducting wire does not have to be cut because the sintered body containing $MgB_2$ is in contact with the outer peripheral surfaces of the superconducting cores. Thus, it is possible to avoid separation caused by thermal strain. In addition, since the sintered body containing $MgB_2$ is in contact with the outer peripheral surfaces of superconducting cores, it is easy to enlarge the contact area between the superconducting cores and the sintered body containing $MgB_2$ and thereby obtain high conduction characteristics.

In addition, since the coefficient of linear expansion of $MgB_2$ is relatively low, the coefficient of linear expansion of the metal sheath is generally larger than the coefficient of linear expansion of the sintered body containing $MgB_2$. In such a case, even if the end of the superconducting wire is not obliquely cut, when the superconducting wire is cooled after heat treatment, a difference occurs in thermal strain between the metal sheath and the sintered body containing $MgB_2$. Since the heat-shrink of the metal sheath is larger, a positional deviation may occur between the interface portions at which the superconducting core and the sintered body containing $MgB_2$ are joined, degrading the conduction characteristics of the connector.

Unlike the above case, in the superconducting wire connector and the method of connecting superconducting wires according to the present embodiment described above, since the sintered body containing $MgB_2$ is in contact with the outer peripheral surfaces of superconducting cores, the effect due to the difference in the coefficient of linear expansion between the metal sheath and $MgB_2$ is small. Heat-shrink that occurs after heat treatment is mainly in the longitudinal direction of the wire. However, since part of the metal sheath and specified portions positioned at an intermediate portion in the longitudinal direction of the wire are removed, thermal strain of the superconducting core along the longitudinal direction of the wire can be reduced. Thus, it is possible to prevent the superconducting core from separating from the sintered body containing $MgB_2$ and thereby obtain high conduction characteristics.

Next, with reference to the figures, description will be made of a modification example in which part of the configuration of the superconducting wire connector and the method of connecting superconducting wires according to the embodiment is modified.

Figure 7:
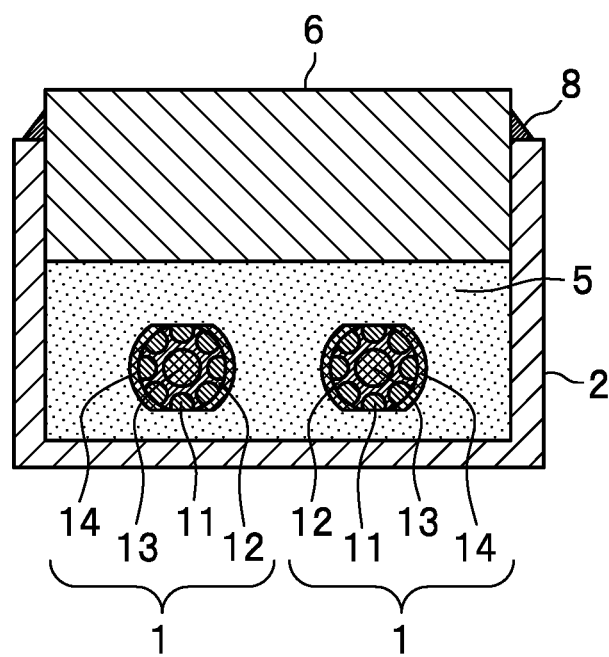
FIG. 7 is a cross-sectional view of a connection structure according to a modification example in which superconducting wires are connected to each other.

FIG. 7 is a cross-sectional view of a connection structure according to the modification example in which superconducting wires are connected to each other.

As illustrated in FIG. 7, the superconducting wire used for superconductive connection may be a wire in which parts of the metal sheath 14 and specified portions in the entire circumference of the wire are removed instead of a wire in which all of the metal sheath 14 and specified portions in the entire circumference of the wire are removed.

In FIG. 7, the metal sheath 14 and the part of the base material 12 on the outside of the superconducting cores 11 are removed at two parts, an upper part in the circumferential direction of the wire and a lower part in the circumferential direction of the wire. The sintered body 5 containing $MgB_2$ is in contact not with the entire circumference of the superconducting cores 11 but with parts of the outer peripheral surface of the superconducting cores 11. Note that the parts of the metal sheath 14 and specified portions that are removed are positioned at an intermediate portion in the longitudinal direction of the wire.

In the case where parts of the metal sheath 14 and specified portions in the circumferential direction of the wire are removed, the parts of the metal sheath 14 and specified portions to be removed are not limited to any particular parts in terms of, for example, the length in the longitudinal direction of the wire, the arc length in the circumferential direction of the wire, the position in the circumferential direction of the wire, and the number of parts to be removed.

In the case where parts of the metal sheath 14 in the circumferential direction of the wire are removed as described above, both sides, in the longitudinal direction of the wire, of the part where the metal sheath 14 is removed remain connected to each other with the unremoved metal sheath 14, unlike the case where all the metal sheath 14 in the entire circumference of the wire is removed. Because the metal sheath 14 on both sides are constrained against deformation, it is possible to reduce the thermal strain that occurs in the metal sheath 14 along the longitudinal direction of the wire when the superconducting wire 1 is cooled after heat treatment.

In the case where parts of the metal sheath 14 and specified portions in the circumferential direction of the wire are removed, the parts of the metal sheath 14 and specified portions to be removed may be positioned point-symmetrically with respect to the center axis of the superconducting wire 1. In the case where parts of the metal sheath 14 positioned point-symmetrically with respect to the center axis of the superconducting wire 1 are removed, the sintered body 5 containing $MgB_2$ is in contact with the outer peripheral surface of the superconducting cores 11 on both sides of the center axis of the superconducting wire 1. The number of parts of the metal sheath 14 to be removed may be two as illustrated in FIG. 7 or may be four or more.

In the case where parts of the metal sheath 14 positioned point-symmetrically with respect to the center axis of the superconducting wire 1 are removed as described above, heat-shrink is less likely to be biased relative to the center axis of the superconducting wire 1, making it less likely for the superconducting wire 1 to warp due to thermal strain, unlike the case where asymmetric parts of the metal sheath 14 are removed. Thus, it is possible to prevent the superconducting core 11 from separating from the sintered body 5 containing $MgB_2$ compared to the case where asymmetric parts of the metal sheath 14 and specified portions are removed.

Note that the superconducting wire 1 may be a parallel wire having a plurality of superconducting cores 11 in parallel with one another in the wire or may be a twist wire having a plurality of superconducting cores 11 twisted in the wire. In the case where the superconducting wires 1 are twist wires, it is possible to make the magnetic field that the superconducting cores 11 undergo uniform.

From the viewpoint of obtaining enough cross-sectional areas of the current paths for transport current, the metal sheath 14 may be removed such that the sintered body 5 containing $MgB_2$ is in contact with each of the superconducting cores 11.

For example, in the case where the superconducting wire 1 is a parallel wire, the metal sheath 14 and specified portions may be removed in parts different in the circumferential direction along the longitudinal direction of the wire or in spiral parts along the longitudinal direction of the wire.

Figure 8:
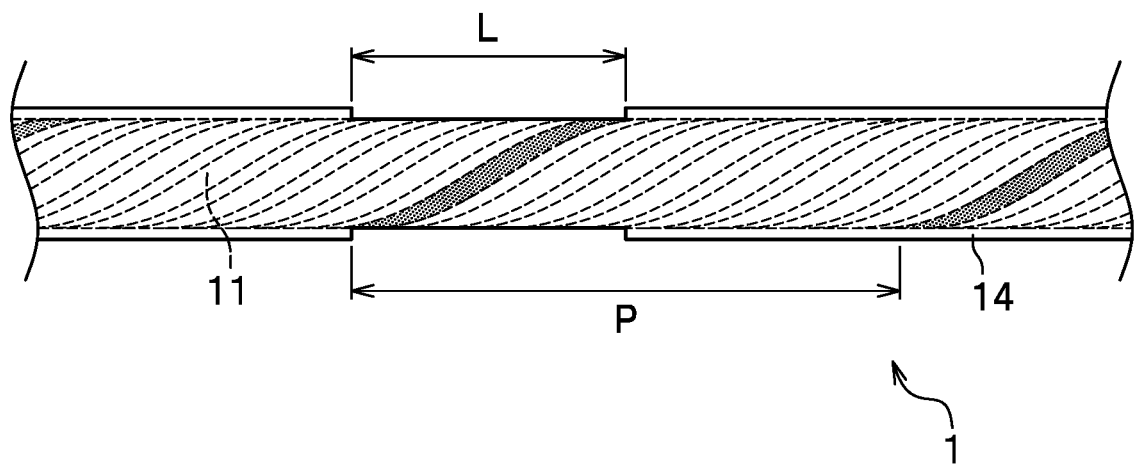
FIG. 8 is a diagram illustrating a superconducting wire in the form of a twist wire in which superconducting cores are twisted.

FIG. 8 is a diagram illustrating a superconducting wire in the form of a twist wire in which superconducting cores are twisted. FIG. 8 illustrates twisted superconducting cores 11 as if the metal sheath 14 is transparent.

As illustrated in FIG. 8, in the case where the superconducting wire 1 is a twist wire, part of the metal sheath 14 and specified portions may be removed such that the part has a specified length in the longitudinal direction of the wire.

Specifically, the length L[m] of the part to be removed of the metal sheath 14 and specified portions in the longitudinal direction of the wire may satisfy the following expression (I), where P is the twist pitch [meters] of the superconducting cores 11, and n is the number of parts [pieces] to be removed of the metal sheath 14 and specified portions in the circumferential direction of the wire.

$$L \geq P/n \qquad (I)$$

Here, the twist pitch means the length in the longitudinal direction of the wire necessary for a superconducting core included in a twist wire and twisted around the center axis of the wire to return to its original position in the circumferential direction.

For example, in the case of n=2 as illustrated in FIG. 7, $L \geq P/2$. In other words, in the case where the superconducting core 11 is a twist wire, the metal sheath 14 and specified portions may be removed in parts the length of which in the longitudinal direction of the superconducting wire is 50% or more of the twist pitch of the superconducting wire. In such cases, as for the part of the metal sheath 14 and specified portions to be removed, the arc length in the circumferential direction of the wire, the position in the circumferential direction of the wire, and other conditions may be determined as appropriate according to the required current density.

In the case where the metal sheath 14 and specified portions of the length described above is removed, the sintered body 5 containing $MgB_2$ can be in contact with each of the superconducting cores 11 included in the twist wire. Thus, enough cross-sectional areas are allocated to the current paths for transport current, making the conduction characteristics of the superconducting wire connector favorable.

Figure 9:
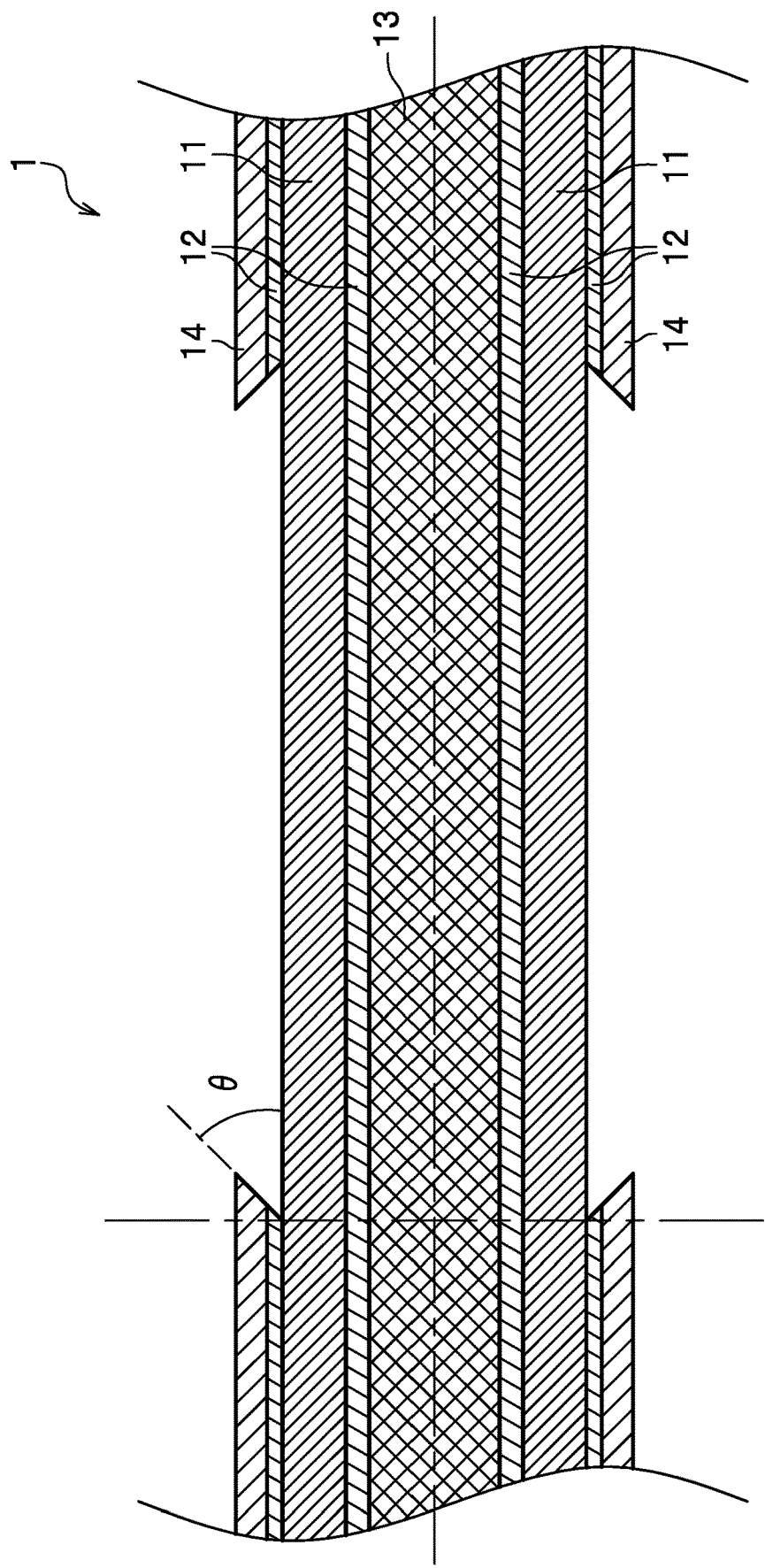
FIG. 9 is an enlarged longitudinal sectional view of the structure of a superconducting wire according to a modification example.

FIG. 9 is an enlarged longitudinal sectional view of the structure of a superconducting wire according to a modification example.

As illustrated in FIG. 9, the superconducting wire for superconductive connection may be a wire in which the length in the longitudinal direction of the wire of the part where the metal sheath 14 and specified portions are removed decreases from the center side of the wire toward the outer periphery.

In FIG. 9, the metal sheath 14 and the part of the base material 12 on the outside of the superconducting cores 11 are removed at a part positioned at an intermediate portion in the longitudinal direction of the wire. Since the part of the metal sheath 14 and specified portions positioned at an intermediate port ion is removed, the outer peripheral surfaces of the superconducting cores 11 and the end surfaces (cross-sectional surfaces) of the metal sheath 14 and the base material 12 are exposed. The metal sheath 14 and the base material 12 have the tapered end surfaces so that the length of the metal sheath 14 and base material 12 in the longitudinal direction of the wire increases from the center side of the superconducting wire 1 toward the outer periphery.

The metal sheath 14 and the base material 12 may be removed such that the angle (θ) formed by the center axis of the superconducting wire 1 and the end surface exposed by removing the part of the metal sheath 14 and base material 12 positioned at an intermediate portion in the longitudinal direction of the wire is smaller than 90 degree. The angle (θ) formed by the center axis of the superconducting wire 1 and the end surface may be 60 degrees for less, and may be 45 degrees or less.

The metal sheath 14 and specified portions may be removed in the entire circumference of the wire or may be removed only in parts in the circumferential direction of the wire. In addition, although in FIG. 9, the metal sheath 14 and the base material 12 are removed such that the sections have tapered end surfaces, the metal sheath 14 and the base material 12 may be removed such that the sections have stepped shapes or curved shapes and that the length of the metal sheath 14 and base material 12 in the longitudinal direction of the wire increases from the center side of the superconducting wire 1 toward the outer periphery. The sintered body containing $MgB_2$ will be in contact with the end surfaces of the metal sheath 14 and the base material 12 exposed by removing the part positioned in an intermediate portion in the longitudinal direction of the wire and part or all of the outer peripheral surfaces of the superconducting cores 11.

In the case where a part the length of which in the longitudinal direction of the wire decreases from the center side of the wire toward the outer periphery is removed as described above, both end surfaces at which the part is removed have recessed shapes relative to the plane orthogonal to the center axis of the superconducting wire 1. Since the raw material for $MgB_2$ can get into the recesses described above, a sintered body containing $MgB_2$ can be produced between both end surfaces. Since the outer periphery sides of the metal sheaths 14 on both sides of the removed part are longer in the longitudinal direction of the wire, the sintered body containing $MgB_2$ serves as an anchor and can be clamped. Thus, even if the metal sheath 14 is heat-shrunk when cooled after heat treatment, this structure prevents the superconducting core 11 from separating from the sintered body containing $MgB_2$, providing high conduction characteristics.

Figure 10:
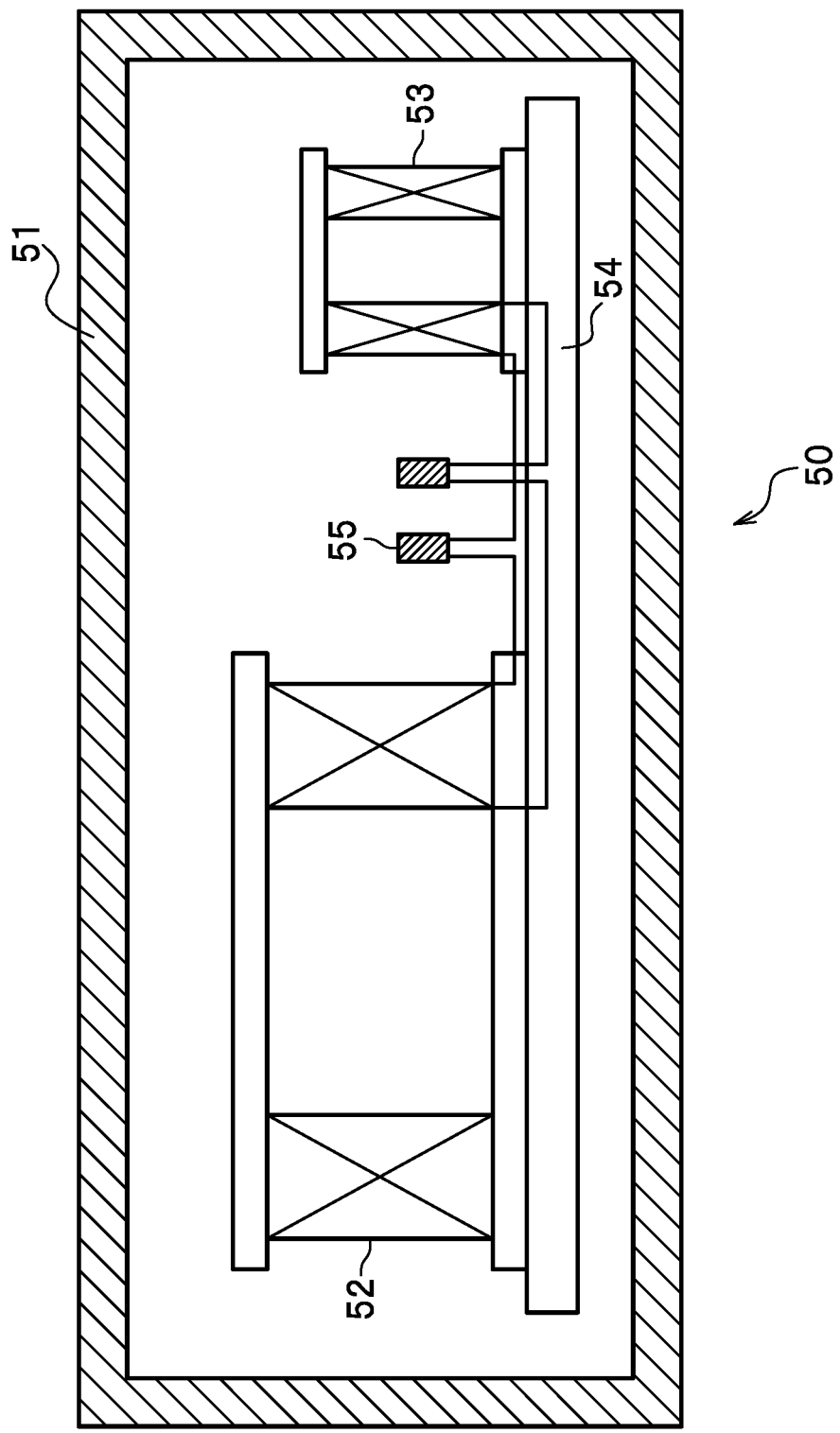
FIG. 10 is a schematic cross-sectional view of an example of a superconducting magnet.

FIG. 10 is a schematic cross-sectional view of an example of a superconducting magnet.

As illustrated in FIG. 10, the superconducting magnet 50 includes a cooling container 51, a superconducting coil 52, a permanent current switch 53, a support plate 54, and superconducting connector 55.

The cooling container 51 houses the superconducting coil 52, the permanent current switch 53, and the support plate 54. The superconducting coil 52 and the permanent current switch 53 are supported on the support plate 54. The superconducting coil 52 and the permanent current switch 53 are cooled by a not-illustrated freezer through conduction via the support plate 54.

The superconducting coil 52 is electrically connected to a not-illustrated power supply via current leads. In FIG. 10, the superconducting connector 55 at which superconducting wires are connected to each other are disposed between the superconducting coil 52 and the permanent current switch 53. In the state where the permanent current switch 53 is off, the power supply supplies the superconducting coil 52 with exciting current, and thereby the superconducting coil 52 is excited.

When the permanent current switch 53 is shifted to a superconducting state, the permanent current switch 53 is switched on, and undamped permanent current flows through the closed circuit including the superconducting coil 52 and the permanent current switch 53. In the permanent current mode, the superconducting magnet 50 provides a static magnetic field with high magnetic-field stability.

The superconducting connector 55 at which superconducting wires are connected to each other need to be at lower than or equal to their critical temperature when the superconducting coil 52 and other units are at the operating temperature so that the superconducting connector 55 can be superconductively connected. The superconducting wire connector and the method of connecting superconducting wires described above can be applied to such superconducting connector 55.

Although the embodiment of the present invention has been described above, the present invention is not limited to the embodiment, but various modifications are possible within the scope not departing from the spirit of the present invention. For example, the present invention is not necessarily limited to configurations that include all the constituents included in the above embodiment. Some of the constituents in an embodiment may be replaced with other constituents, some of the constituents in an embodiment may be added to another configuration, or some of the constituents in an embodiment may be eliminated.

For example, the superconducting wire connector and the method of connecting superconducting wires according to the above embodiment are based on a structure in which the metal container 2 and the pressurizing jig 6 pressurize the raw material for $MgB_2$ from a direction orthogonal to the longitudinal direction of the wire. However, the container of superconductive connection and the pressurizing jig may have a structure for pressurizing the raw material for $MgB_2$ in a direction in parallel with the longitudinal direction of the wire. Alternatively, the structure may be one in which a rubber pressing process or the like is used to pressurize the entire circumferences of superconducting wires.

In addition, the superconducting wire connector and the method of connecting superconducting wires according to the above embodiment use a metal container 2 having a structure in which the superconducting wires 1 penetrate through it. However, the container for superconductive connection may have a structure in which superconducting wires 1 are inserted but not penetrate through it. In the case of using such a metal container, the ends of the superconducting wires 1 have to be coated with a heat-resistant material so that the end surfaces of the superconducting wires 1 are not exposed inside the metal container. For the heat-resistant material, appropriate materials can be used such as a ceramic bond, metal members serving as caps, or the like.

In the superconducting wire connector and the method of connecting superconducting wires according to the above embodiment, two superconducting wires are arranged in parallel with each other and superconductively connected. However, the number of superconducting wires for superconductive connection and their arrangement are not limited to any specific ones. The number of superconducting wires to be superconductively connected to each other may be two, or three or more. In addition, superconducting wires may be inserted in parallel into the container and superconductively connected to be in parallel, or superconducting wires may be inserted from directions opposite to each other into the container and superconductively connected to be in the form of a straight line.

It is understood that the foregoing description is that of the preferred embodiments of the invention and that various changes and modifications may be made thereto without departing from the spirit and scope of the invention as defined in the appended claims.

What is claimed is:

1. A superconducting wire connector comprising:
a plurality of superconducting wires;
a container; and
a sintered body containing $MgB_2$, the sintered body being disposed inside the container,
wherein the superconducting wires are connected by the sintered body,
wherein at least one of the superconducting wires includes a superconducting core having a first outer surface,
wherein a stabilizing material is disposed on an inner periphery of the superconducting core, and a metal sheath covers an outer periphery of the superconducting core,
wherein the sintered body is in contact with the first outer surface of the superconducting core,
wherein at least one of the super conducting wires is disposed through the container,
wherein the metal sheath has an opening at an intermediate portion of the superconducting wire in a longitudinal direction so that the outer peripheral surface of the superconducting wire core is exposed, and
wherein the intermediate portion at which the superconducting wire core is exposed is inside the container, and an end surface of the superconducting wire is outside the container.

2. The superconducting wire connector according to claim 1,
wherein the sintered body is in contact with the first outer surface through the intermediate portion where the metal sheath is removed.

3. The superconducting wire connector according to claim 1,
wherein the opening of the metal sheath is a first opening,
wherein the metal sheath includes a second opening,
wherein the first opening and the second opening are positioned opposite from each other with respect to a center axis of the at least one superconducting wire, and
wherein the sintered body is in contact with the first outer surface through the first opening and the second opening.

4. The superconducting wire connector according to claim 1,
wherein the at least one superconducting wire further includes:
at least one superconducting core having a second outer surface, and
the metal sheath disposed over the superconducting core and the at least one superconducting core twisted together and having an opening,
wherein the at least one of the superconducting wires has a twist pitch,
wherein the opening has a length longer than or equal to 50% of the twist pitch in a longitudinal direction of the at least one of the superconducting wires, and
wherein the sintered body is in contact with the first outer surface and the second outer surface through the opening.

5. The superconducting wire connector according to claim 1,
wherein the metal sheath has an opening where the metal sheath is removed and an edge face adjacent to the opening,
wherein the opening has a length in a longitudinal direction of the at least one of the superconducting wires,
wherein the length increases toward a center axis of the at least one of the superconducting wires, and
wherein the sintered body is in contact with the edge face and the first outer surface through the opening.

6. The superconducting wire connector according to claim 1,
wherein the superconducting core contains $MgB_2$.

7. The superconducting wire connector according to claim 1,
wherein the sintered body has a filling factor of 70% by volume or more.

8. A method of connecting superconducting wires by a sintered body containing $MgB_2$, comprising:
exposing a superconducting core of at least one of the superconducting wires by removing a portion, positioned in the middle in a longitudinal direction of the at least one of the superconducting wires, of a metal sheath disposed around the superconducting core;
disposing the at least one of the superconducting wires through a container;
filling the container with a raw material of $MgB_2$;
forming the sintered body being in contact with an outer surface of the superconducting core by sintering the raw material filled in the container;
disposing a stabilizing material on an inner periphery of the superconducting core; and
disposing an end surface of the superconducting wire outside the container.

9. The superconducting wire connector according to claim 2,
wherein the superconducting core contains $MgB_2$.

10. The superconducting wire connector according to claim 3,
wherein the superconducting core contains $MgB_2$.

11. The superconducting wire connector according to claim 4,
wherein the superconducting core contains $MgB_2$.

12. The superconducting wire connector according to claim 5,
wherein the superconducting core contains $MgB_2$.

13. The superconducting wire connector according to claim 2,
wherein the sintered body has a filling factor of 70% by volume or more.

14. The superconducting wire connector according to claim 3,
wherein the sintered body has a filling factor of 70% by volume or more.

15. The superconducting wire connector according to claim 4,
wherein the sintered body has a filling factor of 70% by volume or more.

* * * * *